(12) United States Patent
Nuebling et al.

(10) Patent No.: US 11,867,762 B1
(45) Date of Patent: Jan. 9, 2024

(54) TECHNIQUES FOR MEASURING VOLTAGE OVER A POWER SWITCH USING ZERO CURRENT DETECTION POINT

(71) Applicant: Infineon Technologies AG

(72) Inventors: Marcus Nuebling, Olching-Esting (DE); Michael Krug, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/056,873

(22) Filed: Nov. 18, 2022

(51) Int. Cl.
*G01R 27/08* (2006.01)
*G01R 31/327* (2006.01)
*G01R 19/175* (2006.01)

(52) U.S. Cl.
CPC ....... *G01R 31/3274* (2013.01); *G01R 19/175* (2013.01)

(58) Field of Classification Search
CPC ............. G01R 31/3274; G01R 19/175
See application file for complete search history.

(56) References Cited

U.S. PATENT DOCUMENTS

| | | | |
|---|---|---|---|
| 6,400,163 B1* | 6/2002 | Melcher | G01R 31/3277 324/715 |
| 9,634,657 B1 | 4/2017 | Zoels et al. | |
| 9,748,947 B1 | 8/2017 | Wagoner et al. | |
| 9,831,824 B2 | 11/2017 | Gazit | |
| 10,020,802 B2 | 7/2018 | Zhao et al. | |
| 10,367,407 B2 | 7/2019 | Geske | |
| 10,516,392 B2 | 12/2019 | Sicard | |
| 10,784,857 B1 | 9/2020 | Li et al. | |
| 10,868,529 B2 | 12/2020 | Norling et al. | |
| 11,362,651 B1 | 6/2022 | Krug et al. | |
| 11,569,798 B2* | 1/2023 | Krug | H03K 3/011 |
| 2004/0207967 A1* | 10/2004 | Ohshima | H03K 17/0822 327/51 |
| 2008/0007318 A1 | 1/2008 | Pace et al. | |
| 2013/0242438 A1 | 9/2013 | Fukuta et al. | |

(Continued)

FOREIGN PATENT DOCUMENTS

| | | |
|---|---|---|
| EP | 1310045 A1 | 5/2003 |
| EP | 2887546 B1 | 11/2018 |

(Continued)

OTHER PUBLICATIONS

U.S. Appl. No. 17/356,114, filed Jun. 23, 2021, naming inventors Krug et al.

*Primary Examiner* — Thang X Le
(74) *Attorney, Agent, or Firm* — Shumaker & Sieffert, P.A.

(57) ABSTRACT

A method may comprise: controlling ON/OFF switching of a power switch via a driver circuit; receiving a first signal on a detection pin associated with the power switch, wherein the first signal corresponds to a first point in time when current is not passing through the power switch and wherein the first signal indicates a first voltage drop over one or more other circuit elements; receiving a second signal on the detection pin, wherein the second signal, wherein the second signal corresponds to a second point in time when current is passing through the power switch and wherein the second signal indicates a voltage drop over the power elements; and determining the voltage drop over the power switch based on a difference between the first signal and the second signal.

25 Claims, 7 Drawing Sheets

(56) References Cited

U.S. PATENT DOCUMENTS

| | | |
|---|---|---|
| 2018/0219543 A1 | 8/2018 | Komo et al. |
| 2019/0204889 A1 | 7/2019 | Kaeriyama et al. |
| 2019/0386654 A1 | 12/2019 | Norling et al. |
| 2020/0021284 A1 | 1/2020 | Thalheim |
| 2020/0132557 A1* | 4/2020 | Strzalkowski ... H03K 17/08116 |
| 2020/0228109 A1 | 7/2020 | Bachhuber |
| 2022/0285927 A1 | 9/2022 | Bacigalupo et al. |

FOREIGN PATENT DOCUMENTS

| | | |
|---|---|---|
| WO | 0217492 A1 | 2/2002 |
| WO | 2020207575 A1 | 10/2020 |

* cited by examiner

TECHNIQUES FOR MEASURING VOLTAGE OVER A POWER SWITCH USING ZERO CURRENT DETECTION POINT

TECHNICAL FIELD

This disclosure relates to power switches, and more specifically, techniques and circuits for monitoring the operation of power switch circuits.

BACKGROUND

Power switches are used in a wide variety of applications in order to control power being delivered to a load. As examples, a power switch may comprise a Field Effect Transistor (FET), am insulated-gate bipolar transistor (IGBT), a bipolar junction transistor (BJT), a gallium nitride (GaN) switch, a silicon carbide (SiC) switch, or possibly a silicon-controlled rectifier (SCR). Examples of FETs may include, but are not limited to, junction field-effect transistor (JFET), metal-oxide-semiconductor FET (MOSFET), dual-gate MOSFET, any other type of FET, or any combination of the same. Examples of MOSFETS may include, but are not limited to, PMOS, NMOS, DMOS, or any other type of MOSFET, or any combination of the same. MOSFETs may be formed in silicon, gallium nitride, silicon carbide, or other materials. Examples of BJTs may include, but are not limited to, PNP, NPN, heterojunction, or any other type of BJT, or any combination of the same.

Power switches are typically controlled by a driver circuit via a modulation control signal, such as pulse width modulation (PWM), pulse frequency modulation (PFM), pulse duration modulation, pulse density modulation, or another type of modulation control signal. Modulation control signals can be applied to the gate of a power switch so as to control on/off switching of the power switch, and thereby control the average amount of power delivered through the power switch to a load. The on/off switching of the power switch effectively chops its power delivery up into discrete parts. The average value of voltage and/or current ted to a load can be controlled by turning the switch on and off at a fast rate. The longer the switch is on compared to the off periods, the higher the total power supplied to the load. In many applications, two different power switches are configured in a high-side and low-side configuration, and the on/off switching of the two power switches is synchronized in order to deliver the desired power to a switch node positioned between the high-side and low-side switch. Moreover, in some system, different sets of high-side and low-side switches may be used to control different phases of a multi-phase electrical motor.

The ability to detect the junction temperature associated with a power switch is highly desirable. To do so, conventional techniques often use external components, such as negative temperature coefficient (NTC) thermistors or semiconductor-based temperature sensors (e.g., temperature sensitive diodes) that are mounted close to the power switch. Unfortunately, these conventional techniques can be imprecise and may result in delayed reactions to temperature-related problems with the switch. For example, external components may measure the temperature of the housing of the switch or a temperature close to the switch with a certain intrinsic delay, but these measurements are not always precisely indicative the junction temperature within the power switch itself.

SUMMARY

In general, this disclosure describes circuits and techniques that are applied by a driver circuit in controlling a power switch. The circuits and techniques can provide protection against power switch malfunction, which may be desirable in a wide variety of circuit applications, especially in settings where safety is a concern. The circuits and techniques can facilitate very accurate voltage measurements of the voltage drop over a power switch by performing two or more voltage measurements at specific times, including at least one first voltage measurement at a first point in time corresponding to when no current is passing through the power switch and at least one second voltage measurement at a second point in time when current is passing through the power switch.

In some cases, the accurate voltage measurements can be used by a driver circuit to detect problems in circuit operation, e.g., a safety check or disaster check on power switch operation. Moreover, in some cases, the accurate voltage measurements can be communicated to a controller (along with current measurements), so that the controller can use these measurements in controlling switch operation, performing safety or disaster checks, or possibly to determine the resistance of the power switch based on Ohm's law. The resistance, in turn, can be mapped to an indication of temperature of the power switch which may be a more precise indication of junction temperature of the power switch that can be achieved using other techniques. Accordingly, in some examples, the techniques can facilitate very accurate measurements of the junction temperature of a power switch.

In one example, this disclosure describes a driver circuit configured to control a power switch. The driver circuit may comprise an output pin, wherein the driver circuit is configured to deliver drive signals from the output pin to the power switch to control ON/OFF switching of the power switch; and a detection pin configured to receive a first signal associated with the power switch, wherein the first signal corresponds to a first point in time when current is not passing through the power switch and wherein the first signal indicates a first voltage drop over one or more other circuit elements. The detection pin may be further configured to receive a second signal associated with the power switch, wherein the second signal corresponds to a second point in time when current is passing through the power switch and wherein the second signal indicates a voltage drop over the power switch in combination with a second voltage drop over one or more other circuit elements. The driver circuit may be configured to determine the voltage drop over the power switch based on a difference between the first signal and the second signal.

In another example, this disclosure describes a system comprising: a controller; and a driver circuit configured to control a power switch based on control signals from the controller. The driver circuit may comprise an output pin, wherein the driver circuit is configured to deliver drive signals from the output pin to the power switch to control ON/OFF switching of the power switch based on the control signals from the controller; and a detection pin configured to receive a first signal associated with the power switch, wherein the first signal corresponds to a first point in time when current is not passing through the power switch and wherein the first signal indicates a first voltage drop over one or more other circuit elements. The detection pin may be further configured to receive a second signal associated with the power switch, wherein the second signal corresponds to a second point in time when current is passing through the power switch and wherein the second signal indicates a voltage drop over the power switch in combination with a second voltage drop over one or more other circuit elements.

The driver circuit may be configured to determine the voltage drop over the power switch based on a difference between the first signal and the second signal.

In another example, this disclosure describes a method comprising: controlling ON/OFF switching of a power switch via a driver circuit; receiving a first signal on a detection pin associated with the power switch, wherein the first signal corresponds to a first point in time when current is not passing through the power switch and wherein the first signal indicates a first voltage drop over one or more other circuit elements; receiving a second signal on the detection pin, wherein the second signal, wherein the second signal corresponds to a second point in time when current is passing through the power switch and wherein the second signal indicates a voltage drop over the power switch in combination with a second voltage drop over one or more other circuit elements; and determining the voltage drop over the power switch based on a difference between the first signal and the second signal.

Details of these and other examples are set forth in the accompanying drawings and the description below. Other features, objects, and advantages will be apparent from the description and drawings, and from the claims.

DETAILED DESCRIPTION

Figure 1:
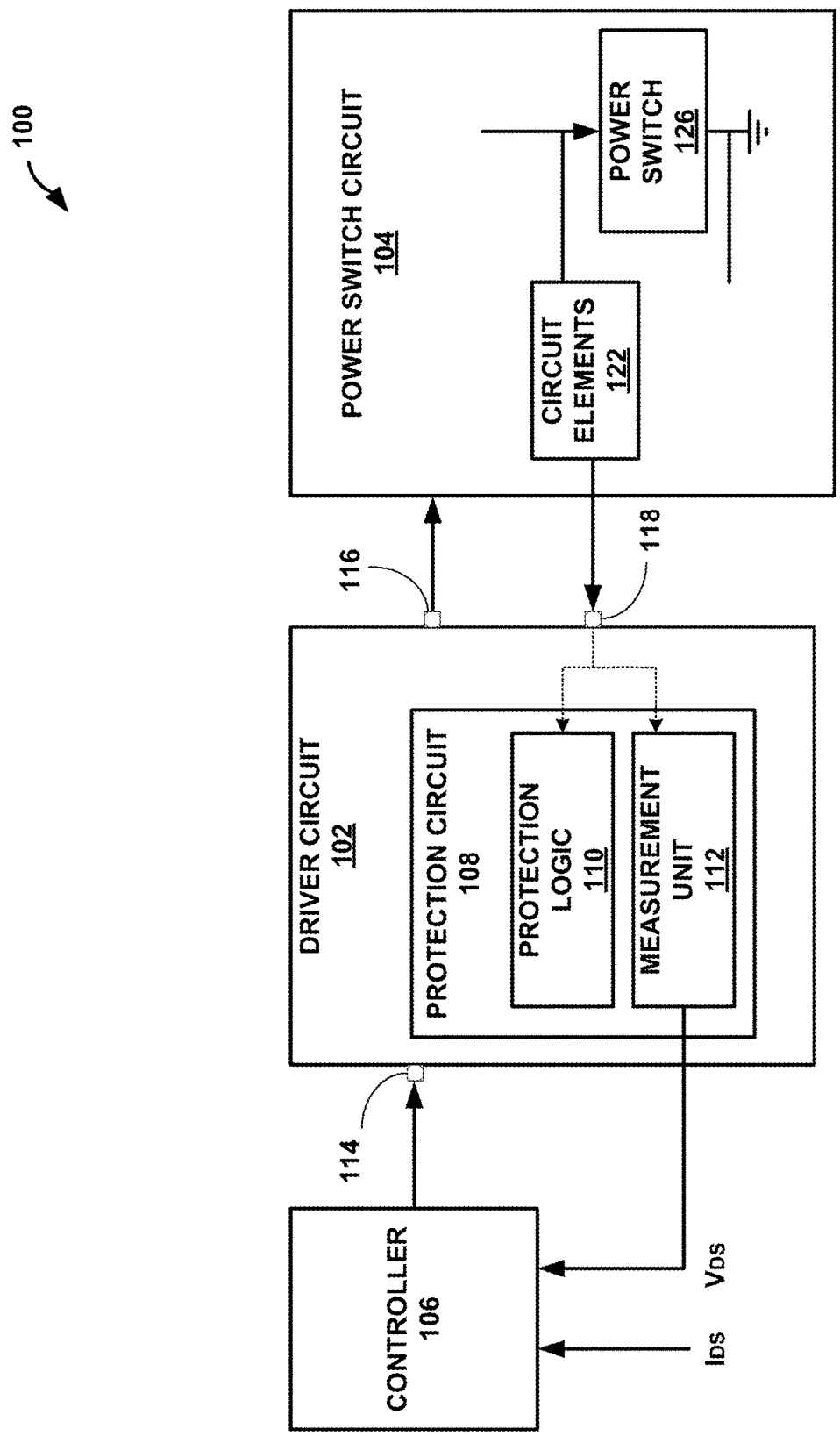
FIG. 1 is a block diagram of an example system that includes a power switch circuit, a driver circuit, and a controller consistent with this disclosure.

This disclosure describes circuits and techniques that are applied by a driver circuit or a larger system that controls a power switch. The circuits and techniques can provide protection against power switch malfunction, which may be desirable in a wide variety of circuit applications, especially in settings where safety is a concern. The circuits and techniques may be useful for accurately measuring a voltage drop over a power switch, and in some cases, the driver circuit or the system may control the power switch based on the measured voltage drop. Moreover, in some cases, the measured voltage drop can be used (along with a current measurement) to determine resistance in the power switch, which in turn, can be used to determine temperature of the power switch. The circuits and techniques of this disclosure may be useful in many applications, such as control of a multi-phase electrical motor of an electric vehicle or another device.

According to this disclosure, a driver circuit may be configured to perform two or more voltage measurements at specific times, including at least one first voltage measurement at a first point in time corresponding to when no current is passing through the power switch and at least one second voltage measurement at a second point in time when current is passing through the power switch. When no current is passing through the power switch, a first voltage measurement may indicate a voltage drop through other circuit elements, such as a diode and/or resistor associated with a detection pin. When current is passing thought the power switch, a second volage measurement may indicate a volage drop over the power switch and a volage drop over the other circuit elements. A driver circuit may be configured to determine the difference between the first voltage measurement and the second volage measurement to get a very accurate indication of the voltage drop over the power switch, without the additional voltage drop over the other circuit elements. In this way, the ability to accurately measure the voltage drop over the power switch may be improved.

In some cases, the accurate voltage measurements can be used by a driver circuit to detect problems in circuit operation, e.g., a safety check or disaster check on power switch operation. Moreover, in some cases, the accurate voltage measurements can be communicated to a controller (along with current measurements), so that the controller can use these measurements in controlling switch operation, performing safety or disaster checks, or possibly to determine the resistance of the power switch based on Ohm's law. The resistance, in turn, can be mapped to an indication of temperature of the power switch which may be a more precise indication of junction temperature of the power switch that can be achieved using other techniques. Accordingly, in some examples, the techniques can facilitate very accurate measurements of the temperature of a power switch.

Furthermore, in some examples, techniques of this disclosure may leverage an already-existing detection pin associated with a driver circuit. The detection pin, for example, may comprise a so-called desaturation (DESAT) pin used to monitor whether a power switch is operating in a desaturation mode. If a power switch is operating in the desaturation mode, as determined by a signal on the DESAT pin, the power switch may be disabled. Moreover, according to this disclosure, the signals on the DESAT pin may be used in performing two or more voltage measurements at specific times, including at least one voltage measurement at a point in time corresponding to when no current is passing through the power switch. In this case, a difference between the first and second signals on the DESAT pin indicate voltage drop over the power switch, and any additional voltage drop associated with other circuit elements seen on the DESAT pin may be canceled by identifying the difference between the first and second signals. In other examples, however, the techniques of this disclosure may also be performed using measurements from an overcurrent detection pin (OCP) or using a dedicated voltage detection pin.

FIG. 1 is a block diagram of an example system 100 that includes a power switch circuit 104, a driver circuit 102, and a controller 106. Controller 106 may comprise a microprocessor configured to control driver circuit 102. In particular, controller 106 sends command signals to driver circuit 102 via input pin 114. Based on these command signals, driver circuit 102 sends ON/OFF signals (e.g., gate control signals via output pin 116) to power switch circuit 104 to turn the power switch ON or OFF.

Driver circuit 102 may control power switch circuit 104 via modulation signals on output pin 116, which may control the ON/OFF switching of power switch 126 within power switch circuit 104. The modulation signals, for example, may comprise pulse width modulation (PWM) signals, pulse frequency modulation (PFM) signals, pulse duration modulation signals, pulse density modulation signal, or another type of modulation control signal use to control a power transistor. In normal operation, the signals from driver circuit 102 over output pin 116 can be applied to the gate (or other control terminal) of power switch 126 within power switch circuit 104 so as to control on/off switching of power switch 126, and thereby control the average amount of power delivered through the power switch to a load (not shown in FIG. 1).

In the most general sense, driver circuit 102 may comprise any type of driver for any type of power switch, e.g., a high-side switch driver, a low-side switch driver, a driver within a flyback power converter, or any driver used in any circuit arrangement that controls ON/OFF switching of one or more power switches. Driver circuit 102 may include a DC/DC power converter, in some examples. Moreover, in some situations, driver circuit 102 may be duplicated for controlling many switches. For example, a three-phase electric motor may be controlled by six power switches that form three half-bridges of high-side and low-side switches. In this example, the techniques of this disclosure may be performed by different driver circuits that control each of the six different power switches.

Power switch 126 may comprise a power transistor, such as a metal oxide semiconductor field effect transistor (MOSFET). The MOSFET may be formed in silicon, in which case the MOSFET may be called a silicon MOSFET. Alternatively, the MOSFET may be formed in another semiconductor material, such as silicon carbide (SiC) or gallium nitride (GaN), in which case the MOSFET may be called a SiC MOSFET or a GaN MOSFET. Indeed, the techniques of this disclosure may be especially useful for monitoring SiC MOSFETS that are used for controlling a three-phase electric motor, such as those used to power electric vehicles.

In the example shown in FIG. 1, driver circuit 102 includes protection logic circuit 108 connected to a detection pin 118. Detection pin 118 may comprise a so-called DESAT pin and protection logic 110 may be configured to determine whether a power switch 126 is operating in a desaturation mode. In this case, protection logic 110 may be configured to disable power switch 126 in response to detecting that power switch 126 within power switch circuit 104 is operating in the desaturation mode. For example, in order to detect whether power switch 126 is in the desaturation mode, protection logic 110 may be configured to compare a signal magnitude of the signal on detection pin 118 to a desaturation threshold when the power switch is ON. The signal detected on first detection pin 118, for example, may comprise a measure of the voltage drop across the power switch 126 along with a voltage drop across other circuit elements 112 associated with detection pin 118. In other examples, however, detection pin 118 may correspond to a so-called overcurrent detection pin (OCP), another existing pin, or a dedicated pin for power switch voltage detection.

In some examples according to this disclosure, in addition to checking on DESAT (or as an alternative to checking on DESAT), one or more other techniques may be performed based on voltage signals measured on detection pin 118. For example, measurement unit 112 may be configured to receive a first signal on detection pin 118 associated with power switch circuit 104, wherein the first signal corresponds to a first point in time when current is not passing through power switch 126. In this case, the first signal indicates a first voltage drop over one or more other circuit elements 122 since there isn't a voltage drop over power switch 126. Then, at a different point in time, measurement unit 112 may be configured to receive a second signal on detection pin 118. The second signal corresponds to a second point in time when current is passing through power switch 126, and therefore, the second signal indicates a voltage drop over power switch 126 in combination with a second voltage drop over one or more other circuit elements 122. Measurement unit 112 may be configured to determine the voltage drop over power switch 126 based on a difference between the first signal and the second signal. In this way, measurement unit 112 can remove the effect of circuit elements 122 to get a very accurate measurement of the voltage drop over power switch 126.

In some examples, driver circuit 102 may be configured to output an indication of the voltage drop over power switch 126 to controller 106. For example, circuit 112 may be configured to output signal VDS to controller 106. In addition, a current sensing unit (not shown in FIG. 1) may be configured to send a current measurement associated with current through power switch 126 to controller 106 (shown in FIG. 1 as current signal IDs).

Figure 3:
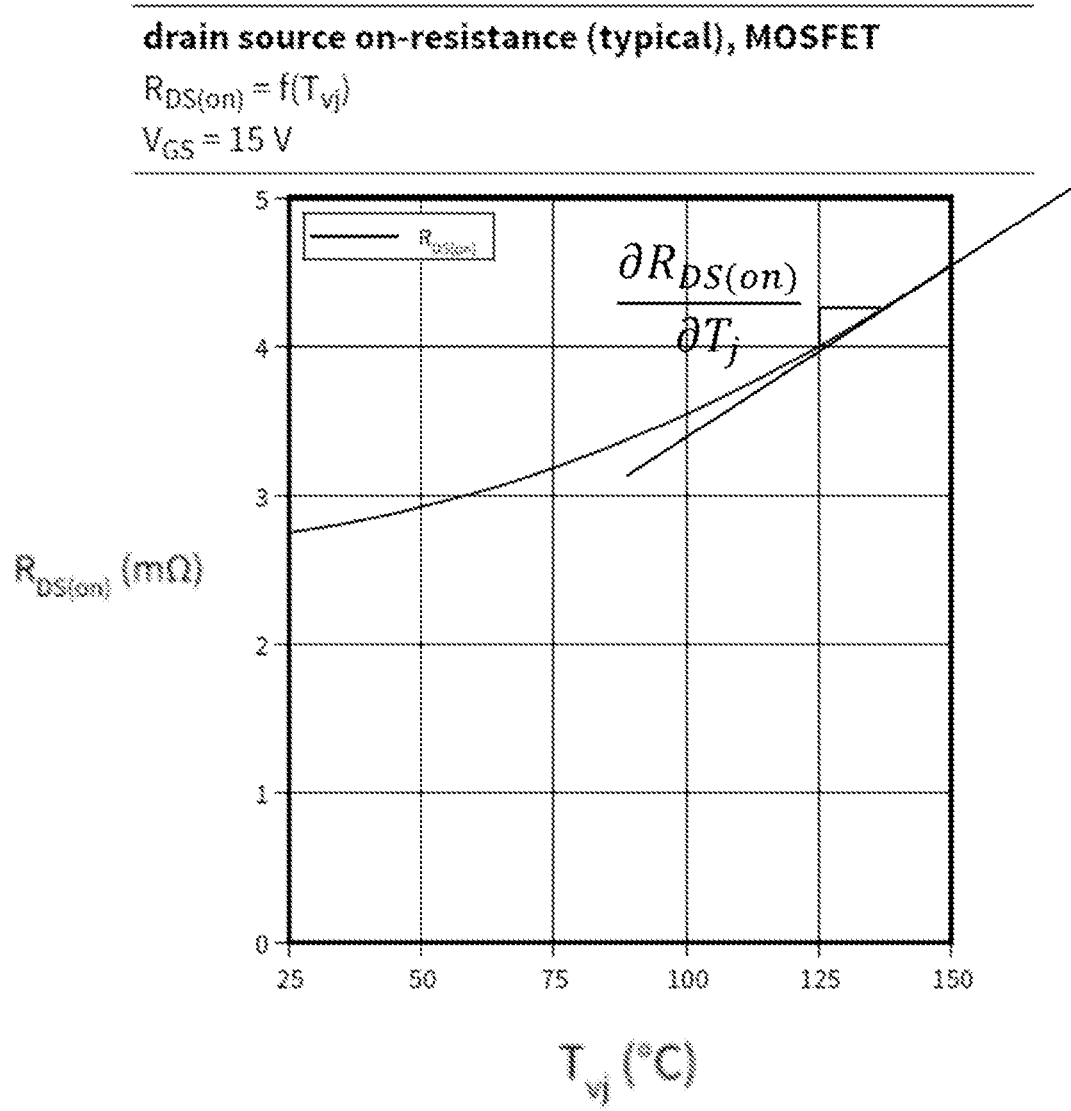
FIG. 3 is a graph showing one example relationship between resistance and juncture temperature within a power switch.

Controller 106 may be configured to receive the indication of the voltage drop (e.g., $V_{DS}$), receive the indication of current (e.g., IDs), and calculate a resistance of power switch 126 based on VDS and IDS, e.g., using Ohm's law. Moreover, in some cases, controller 106 may be configured to determine a temperature of power switch 126 based on the calculated resistance. The relationship between resistance and temperature may be defined by controller 106 based on a mathematical relationship or based on a lookup table (LUT). FIG. 3, for example, is a graph showing a relationship between the junction temperature of a power switch and resistance through the power switch. This relationship or other temperature-resistance relationship can be stored in or calculated by controller 106 so that resistance measurements can be mapped to temperature by controller 106. Thus, in some cases, controller 106 may be configured to control driver circuit 102 based on the determined temperature.

In some cases, however, it may be unnecessary to calculate temperature. Instead, in some examples, the voltage measurement VDS itself may provide sufficient information for driver circuit 102 or controller 106 to make control decisions for power switch 102. For example, VDS itself may be used by driver circuit 102 or by controller 106 as a safety check or disaster check on the operational integrity of power switch 126. Thus, in some cases, controller 106 may be configured to define the control signals based on the determined voltage drop. Also, in some cases, controller 106 may be configured to disable power switch 126 based on the determined voltage drop (e.g., if the voltage drop is out of the safe operational voltage range for power switch 126). Similarly, in some cases, driver 102 may be configured to control ON/OFF switching of power switch 126 based on the determined voltage drop, and/or, in some cases, driver circuit 102 may be configured to disable power switch 126 based on the determined voltage drop (e.g., if the voltage drop is out of the safe operational voltage range of power switch 126).

Figure 2:
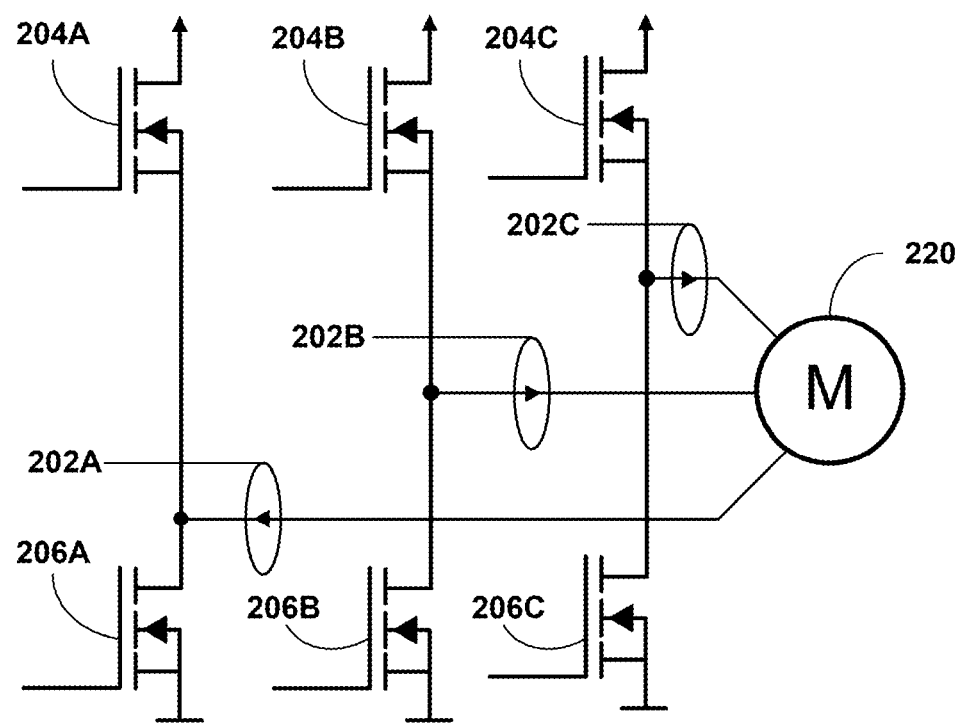
FIG. 2 is an example circuit diagram showing six power switches arranged to define three half-bridges for controlling a three-phase electric motor.

FIG. 2 is an example circuit diagram showing six power switches arranged to define three half-bridges for controlling a three-phase electric motor 220. High side switch 204A and low side switch 206A define a first half-bridge for controlling current delivered to motor 220 in a first phase. Similarly, high side switch 204B and low side switch 206B define a second half-bridge for controlling current delivered to motor 220 in a second phase. Furthermore, high side switch 204C and low side switch 206C define a third half-bridge for controlling current delivered to motor 220 in a third phase. A first current sensing unit 202A may be configured to sense the current in the first phase, a second current sensing unit 202B may be configured to sense the current in the second phase, and a third current sensing unit 202C may be configured to sense the current in the third phase. This current sensing may be used as part of a current control loop to help balance the current among the different phases. In addition, according to this disclosure, the currents sensed by current sensing units 202A, 202B, and 202C can be sent to a controller (e.g., IDS sent to controller 106 in FIG. 1) for use in performing one or more techniques of this disclosure. Each of switches 204A, 206A, 204B, 206B, 204C, and 206C may be controlled by a driver circuit (similar to driver circuit 102 of FIG. 1), and each of the driver circuits may be configured to perform the voltage detection techniques (and/or other techniques) of this disclosure.

FIG. 3 is a graph showing one example relationship between resistance and junction temperature within a power switch. As demonstrated in FIG. 3, the resistance of a power switch (shown in the Y axis) rises as a function of the junction temperature of the switch (shown in the X axis). Thus, an accurate measurement of the resistance of a power switch can be mapped to an accurate junction temperature of the power switch. Also, when there is a defined relationship between resistance and temperature, a calculated resistance could also be used as a proxy for junction temperature without actually mapping the resistance to a temperature. In some examples of this disclosure, a microcontroller (e.g., controller 106 of FIG. 1) may leverage the temperature-resistance relationship of a power switch (e.g., applying a mathematical function or a lookup table) in order to determine junction temperature of a power switch based on a calculated resistance.

SiC power MOSFETs may be used to switch currents in the range of several hundred Amperes for automotive high voltage applications or other applications. Kilowatts of power losses are generated that need to be dissipated in a cooling solution. Therefore, SiC power MOSFETs with optimized thermal behavior are desirable to increase the power density of the inverter system. To increase the power density without sacrificing MOSFET reliability, an accurate means of measuring device temperature is desirable. The more accurate the temperature measurement, the more can be saved on the thermal design or the more system performance can be derived from an existing thermal solution.

Some measurement techniques for SiC MOSFET modules use a negative temperature coefficient (NTC) thermistor placed inside the module. This approach, however, has several drawbacks, such as NTC thermistor tolerance and loose thermal coupling to the SiC MOSFET die due to separation. Furthermore, NTC thermistors often have a long settling time.

High thermal margins are sometimes used to ensure that a SiC MOSFET is not working out of its specification, but high thermal margins add cost and complexity to the circuits. Furthermore, a complicated algorithm-based calculation model is sometimes needed to interpolate the SiC MOSFET junction temperature based on the arbitrary NTC-based temperature measurement. In contrast, with the techniques of this disclosure, the accuracy and the response time of a temperature measurement of a power MOSFET can be increased by a precise voltage measurement of the drain source channel in the ON state of the SiC MOSFET.

Figure 4:
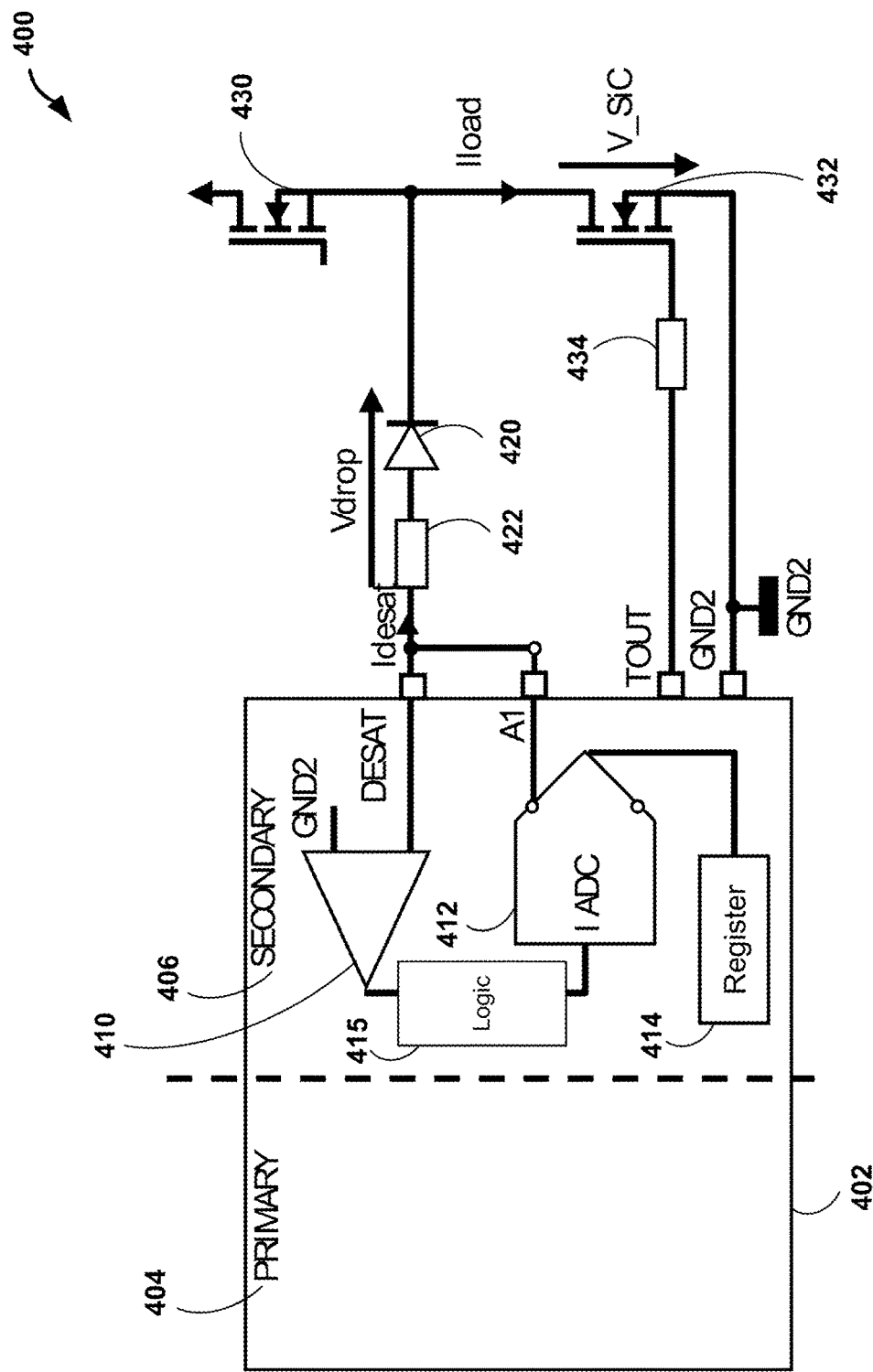
FIG. 4 is a circuit diagram of an example driver circuit configured to control a power switch consistent with this disclosure.

FIG. 4 is a circuit diagram of a system 400 in which an example driver circuit 402 is configured to control a power switch 432 consistent with this disclosure. Power switch 432 may comprise a low-side switch arranged relative to a high side switch 430. In this case, a so-called switch node associated with a load delivers current to the load. In the example of controlling a three-phase electric motor, driver circuits similar to driver circuit 402 may be used for each of power switches 204A, 206A, 204B, 206B, 204C, and 206C shown in FIG. 2. A high-side switch 430 is shown in FIG. 4, but the high-side driver circuit is not shown in FIG. 4 for ease of illustration.

Driver circuit 402 may include a galvanic isolation barrier between a primary side and a secondary side of driver circuit 402. The primary side may operate in a lower voltage domain than the secondary side. The galvanic isolation may use one or more transformers, such as one or more so-called "coreless" transformers that use two stacked windings. Alternatively or additionally, galvanic isolation of one or more components of driver circuit 402 may use one or more capacitors to achieve capacitive galvanic isolation. In still other examples, galvanic isolation of one or more components of driver circuit 402 may use an inductive sender and a magnetic receiver. Optical signals and optocouplers could also be used for communication across a galvanic barrier. These or other components may be used to ensure that components on secondary side 406 of driver circuit 402 are separated from primary side 404 with a galvanic barrier.

Primary side pins (not shown in FIG. 4) may be connected to a microcontroller (e.g., controller 106 of FIG. 1) so that the microcontroller can send and receive information for controlling driver circuit 402. The microcontroller may send commands to driver circuit 402. Based on the input commands, driver circuit 402 may be configured to deliver drive signals from T OUT pin to power switch 432 to control ON/OFF switching of power switch 432. A resistor 434 may be positioned between the T OUT pin and the gate of power switch 432. A ground pin associated with GND 2 may be connected to a reference voltage (e.g., ground).

The label "Iload" in FIG. 4 may correspond to the so-called switch node associated with the load, which may comprise one phase of a multi-phase electric motor. Driver circuit 402 may comprise a primary side 404 and a secondary side 406 separated by a galvanic isolation barrier. Driver circuit 402 may generally correspond to driver circuit 102, in some examples. In such examples, elements 410, 412 and 414 of driver circuit 402 may correspond to measurement unit 112 of driver circuit 102. In general, driver circuit 402 may be configured to control power switch 432 via gate control signals from T OUT pin, which may pass though an output resistor 434 to the gate of power switch 432.

The example shown in FIG. 4 includes a DESAT pin, an A1 pin, a T OUT pin, and GND2 pin. In some examples, the A1 pin and the DESAT pin may be combined into a single pin, but the A1 pin and DESAT pin are shown separately in FIG. 4 to aid the description below. Combining the pins into one single pin has the advantage of pin reduction. As shown in FIG. 4, the voltage on the DESAT Pin of driver 402 shows the voltage drop over a DESAT resistor 422, the voltage drop over a DESAT diode, and the voltage drop over power switch 432 in any condition, even if power switch 432 is off. Input A1 from A1 PIN of driver circuit 402 is delivered to an analog to digital converter (ADC) 412, which is directly connected to DESAT resistor 422 to measure the complete voltage drop over the circuit including DESAT resistor 422, DESAT diode 420 and power switch 432.

In the half bridge configuration shown with high-side switch 430 and low side switch 432, the resulting current through switches 430 and 432 may comprise sinusoidal wave. Every sine will pass the zero-current 2 separate times inside one cycle. In some examples, driver circuit 402 may be configured to detect the change of the current direction inside the system by either using a voltage monitor on the DESAT, a current measurement on an OCP (not shown) or an additional channel on the ADC 412 which measures the voltage below GND2. In the example shown in FIG. 4, amplifier 410 may comprise a voltage monitor configured to detect the change of the current direction inside the system. Logic 415 of driver circuit 402 is configured to output a trigger signal to ADC 412 in response to amplifier 410 detecting the change in current direction.

Driver circuit 402 may be configured to trigger a measurement to measure the zero-current voltage drop which is reflecting the voltage drop of the diode and the resistor without any voltage drop over power switch 432 since the measurement is made in the zero-current measurement point. In some examples, the zero-current voltage drop value may be stored in a memory, e.g., memory register 414. This zero-current voltage drop can be subtracted from a separate measurement when current is passing through power switch 432. In some examples, the zero-current voltage can be set as the reference when measuring the voltage drop shown on the DESAT input at the DESAT pin, when high current is flowing through power switch 432. The result of the subtraction defines the voltage drop over power switch 432 without including the voltage drop of the additional elements, i.e., without the voltage drop over DESAT resistor 422 and DESAT diode 420.

Power switch 430 and 432 may each comprise a silicon metal oxide semiconductor field effect transistors (MOSFET), a silicon carbide (SiC) MOSFET, or a gallium nitride (GaN) MOSFET. These types of power switches are useful for controlling multiphase electric motors, such as those used with electric vehicles.

In some examples, driver circuit 402 may be configured to control or adjust the ON/OFF switching of the power switch 432 based on the determined voltage drop, which according to this disclosure, may comprise a more accurate determination of the voltage drop than can be achieved with other techniques. Again, in some examples, driver circuit 402 may be capable of detecting problems in circuit operation, e.g., a safety check or disaster check on power switch operation based on the determined voltage drop over power switch 432.

Moreover, in some cases, the accurate voltage measurements can be communicated from primary side 404 to a controller (along with current measurements from current sensing units 202A, 202B, 202C), so that the controller can use these measurements in controlling power switch operation, performing safety or disaster checks, or possibly to determine the resistance of the power switch based on Ohm's law. The resistance, in turn, can be mapped to an indication of temperature of the power switch which may comprise a more precise indication of junction temperature of the power switch that can be achieved using other techniques. Accordingly, in some examples, the techniques of this disclosure can facilitate a controller to perform very accurate determinations of the temperature of a power switch.

For example, a controller (not shown in FIG. 4) may be configured to receive the indication of the voltage drop over power switch 432. The controller may also receive an indication of current through power switch 432 (e.g., from a current sensing unit that forms part of a current control loop), and calculate a resistance of the power switch based on the indication of the voltage drop and the indication of the current, such as by applying Ohm's law. The controller may be configured to determine a temperature of the power switch based on the calculated resistance, and to control driver circuit 402 based on the determined temperature.

Also, in some cases, a safety check or disaster check on the operation of power switch 432 can be performed by the controller based on the determined voltage drop over power switch 432. In other words, either the driver itself, or the controller that sends commands to the driver may perform safety checks or disaster checks on the operation of power switch 432 based on the determined voltage drop.

In other situations, where a driver circuit cannot itself detect the change of the current direction, ADC 412 may be configured to receive an external trigger (e.g., from a microcontroller) to measure the zero-current voltage drop.

In some examples, driver circuit 402 is configured to control power switch 432, and driver circuit 402 comprises an output pin (e.g., T OUT), wherein driver circuit 402 is configured to deliver drive signals from the output pin to power switch 432 to control ON/OFF switching of power switch 432. Driver circuit 402 may also comprise a detection pin (e.g., DESAT pin) configured to receive a first signal associated with power switch 432, wherein the first signal corresponds to a first point in time when current is not passing through power switch 432 and wherein the first signal indicates a first voltage drop over one or more other circuit elements (e.g., DESAT resistor 422 and DESAT diode 420). The detection pin may be further configured to receive a second signal associated with power switch 432, wherein the second signal corresponds to a second point in time when current is passing through power switch 432 and wherein the second signal indicates a voltage drop over power switch 432 in combination with a second voltage drop over one or more other circuit elements (e.g., DESAT resistor 422 and DESAT diode 420). Driver circuit 402 may be configured to determine the voltage drop over power switch 432 based on a difference between the first signal and the second signal.

In some examples, driver circuit 402 may further comprise a memory (e.g., register 414) configured to store the first signal. Moreover, driver circuit 402 may be configured to periodically update the first signal stored in the memory, e.g., every sinusoidal cycle or every Nth cycle, where N is a positive integer.

In some examples, driver circuit 402 comprises an analog-to-digital converter (e.g., ADC 412) configured generate an output signal indicative of the difference between the first signal and the second signal, wherein the driver circuit is configured to communicate the output signal to a controller that controls driver circuit 402.

In the example using the DESAT pin, the one or more other circuit elements comprise a diode and a resistor, although the other circuit elements may be different if other types of pins are used for the voltage detection, such as an OCP. When the detection pin comprises a desaturation (DESAT) detection pin, the driver circuit 402 may further comprise protection logic (similar to protection logic 110 of FIG. 1) that is configured to detect whether the power switch is in a desaturation mode based on a magnitude of the first signal, in which case, driver circuit 402 may be further configured to disable power switch 432 in response to detecting that power switch 432 is in the desaturation mode. In this case, driver circuit 402 may also be configured to deliver a current on the detection pin (e.g., the DESAT pin) when power switch 432 is turned on.

Figure 5A:
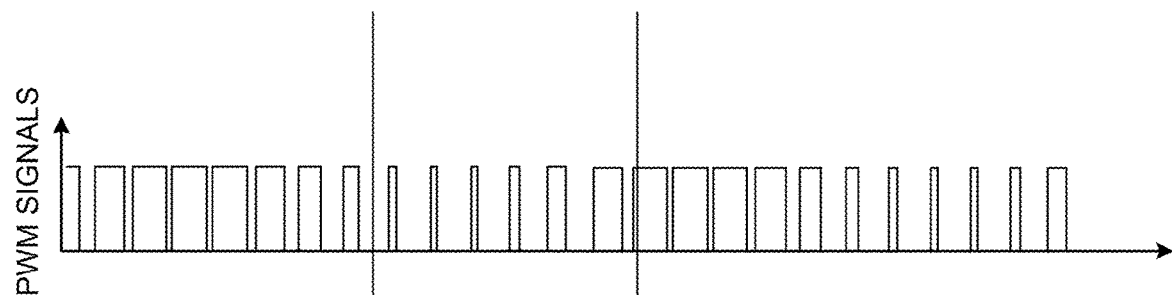
FIGS. 5A-5E are timing diagrams of various signals associated with power switch operation.
Figure 5B:
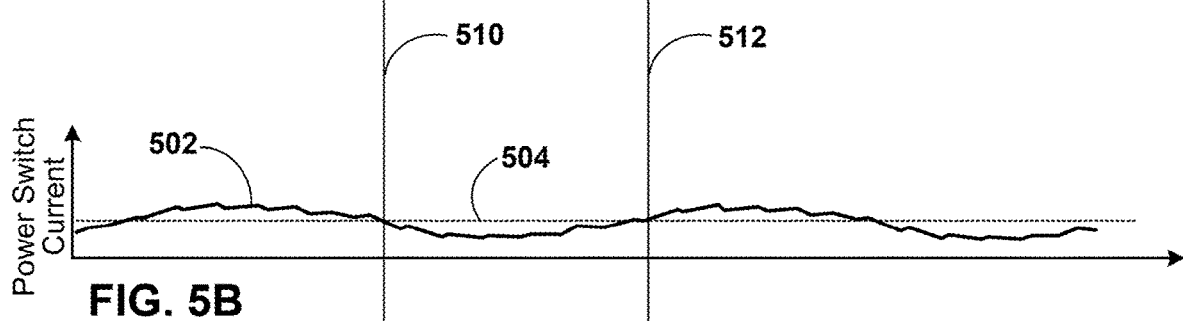
Figure 5C:
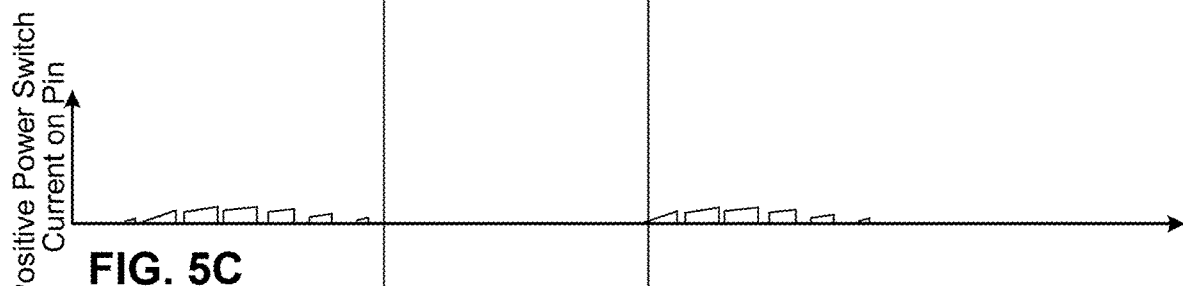
Figure 5D:
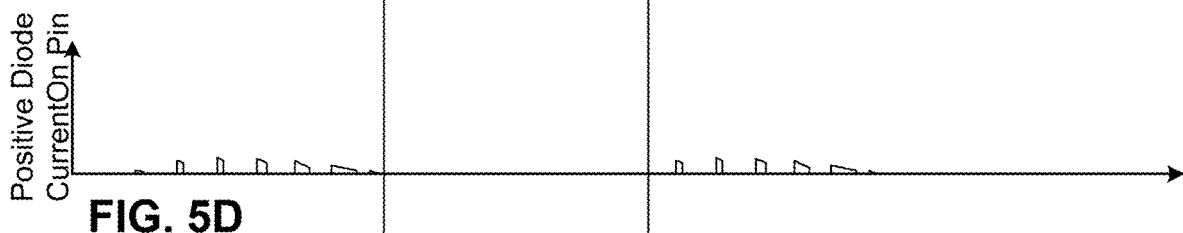
Figure 5E:
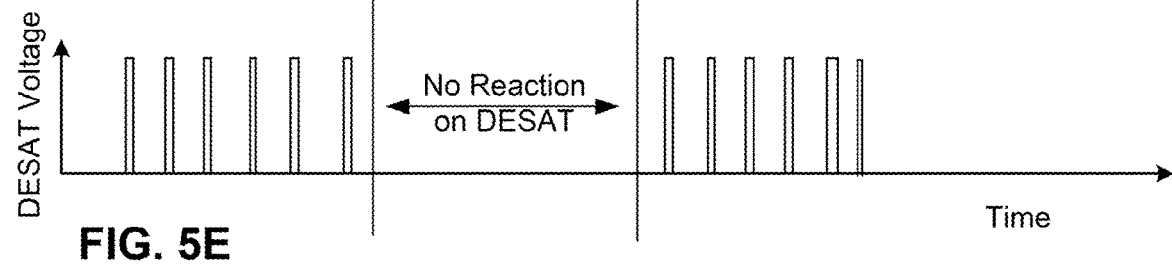

FIGS. 5A-5E are timing diagrams of various signals associated with power switch operation. FIG. 5A shows some example PWM signals that may be sent from a driver circuit to the gate of a power switch to control the power switch. FIG. 5B shows corresponding current 502 through the power switch, which generally follows a sinusoidal curve that goes above and below a zero point 504. The current 502 may follow a sinusoidal curve due to induction currents associated with several phases a multiphase induction machine, such as a multi-phase electric motor. FIG. 5C shows positive current associated with the power switch as seen on a detection pin, and FIG. 5D shows positive current associated with a DESAT diode and resistor seen on the detection pin. FIG. 5E shows the DESAT voltage measurable on the detection pin, including a time window where there is no reaction on the DESAT monitoring pin due to current 502 being below zero. Points in time 510 and 512 correspond to zero current detection points where driver circuit may be configured to perform a first measurement to identify the voltage drop over other elements (e.g., DESAT resistor 422 and DESAT diode 420) without including any voltage drop over the power switch (e.g., power switch 432).

In some cases, the circuits and techniques of this disclosure may enable the ability to determine temperature of the drain-to-source channel of power switch 432 in a simple and cost-effective manner by correlating a precise voltage measurement with temperature consistent with FIG. 3. This may increase the reliability as the response of the temperature determination is fast and directly reflects the die temperature. In contrast, when measuring with an NTC which is placed nearby, the response time is slower, and high current peaks are not recognized and the accuracy is degraded.

In some cases, driver circuit 402 is configured to control the ON/OFF switching of the power switch based on the determined voltage drop over the power switch 402. In different examples, driver circuit 402 can be configured to define the first point in time based on a current changing direction in the power switch in a variety of ways. For example, zero detection may be identified as shown in FIG. 5B by identifying points in time 510 and 512 that correspond to the zero voltage crossing points. Alternatively, zero voltage detection points could be identified by OCP detection, especially if used with power switches that comprise insulated gate bipolar transistors (IGBTs). Also, a driver circuit may be configured to perform direct current sensing, or zero current detection points may be known by microcontroller for defining the duty cycles of the power switches, in which case a microcontroller could provide the triggers for voltage measurement times.

In some examples, the controller (e.g., controller 106 of FIG. 1) may be configured to: receive an indication of the voltage drop over the power switch; receive an indication of current through the power switch; and calculate a resistance of the power switch based on the indication of the voltage drop over the power switch and the indication of the current. In this case, the controller may be configured to determine a temperature of the power switch based on the calculated resistance (such as by applying the relationship shown in FIG. 3), and control the driver circuit based on the determined temperature.

Figure 6:
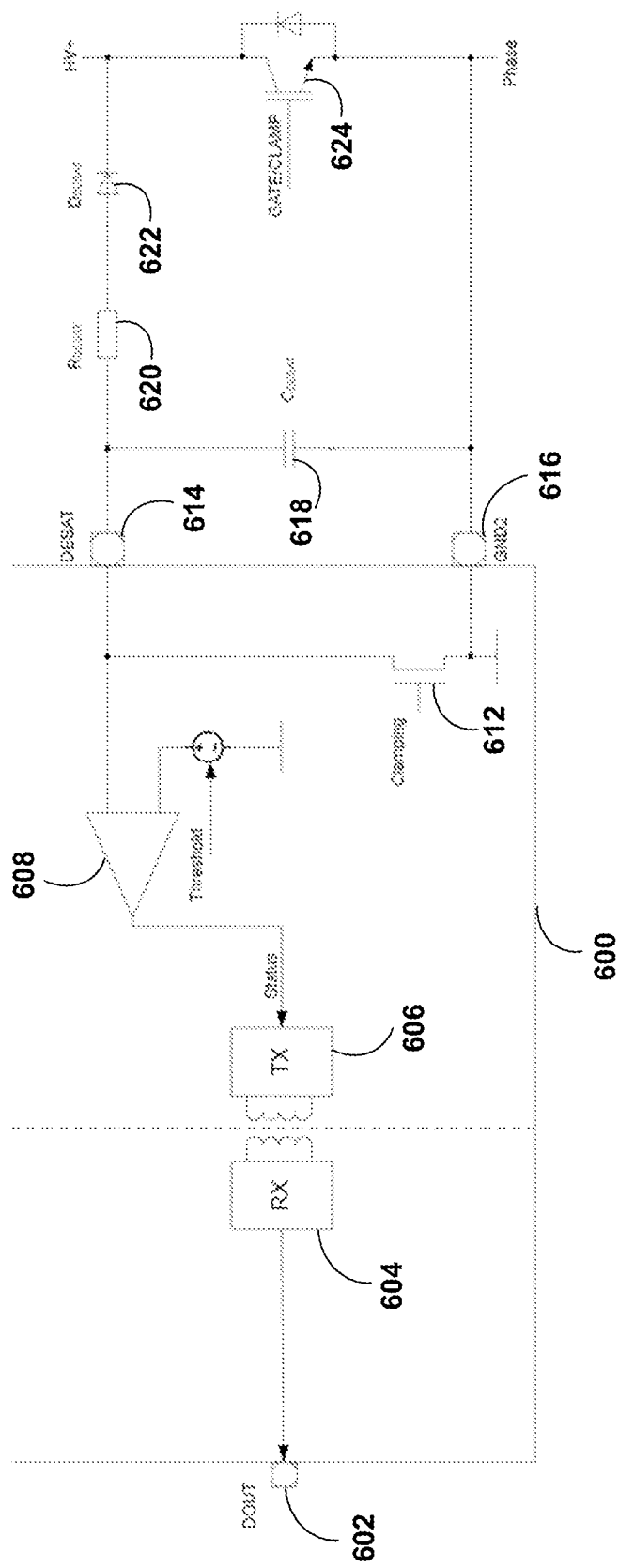
FIG. 6 is another circuit diagram of a driver circuit configured to control a power switch consistent with this disclosure.

FIG. 6 is another circuit diagram of a driver circuit 600 configured to control a power switch 624 consistent with this disclosure. DESAT pin 614 may define a detection pin that is connected to DESAT capacitor 618 and DESAT resistor 620. A ground pin GND2 616 is connected to the source of power switch 624. The voltage drop shown on DESAT pin 614 may correspond to the voltage drop over DESAT resistor 620, the voltage drop over DESAT diode 622 and the volage drop over power switch 624. Consistent with the techniques of this disclosure, driver circuit 600 may be configured to perform at least two voltage measurements on DESAT pin 614, including at least one first voltage measurement at a specific point in time when no current is flowing through power switch 624 and at least one second voltage measurement at a specific point in time when current is flowing through power switch 624. Then, the difference between the first and second voltage measurements may define a very accurate measurement of the voltage drop over power switch 624.

Amplifier 608, for example, may comprise a voltage monitor configured to detect a zero current detection point to trigger a first voltage measurement, e.g., when switch 612 is deactivated. Then, a second voltage measurement, e.g., again upon deactivating switch 612, is made when current is flowing through power switch 624. Transmitter 606 and receiver 604 facilitate data transfer across a galvanic isolation barrier so that information can be sent to a microprocessor via pin 602.

When driver circuit 600 does not see a change in the voltage on the DESAT pin, the voltage on the DESAT Pin is measured. At this point in time, the current through the power switch is changing its own current direction and is passing 0 Ampere. When 0 Ampere is flowing through power switch 624, the voltage measurement of the DESAT pin is just indicating the voltage drop on DESAT diode 620 and DESAT resistor 622.

Thus, according to some examples of this disclosure, a driver is configured to detect via the DESAT pin, the direction of the phase current. When the current direction is changing, the driver circuit may be configured to trigger a measurement to measure the voltage drop on the DESAT pin. This measurement reflects the voltage drop Vdrop, where Vdrop is defined as zero-current voltage drop. This measurement may be saved inside a register and updated periodically. Then, during high current operation, several additional measurements are taken. The value stored in the register can be subtracted from the additional measurements to provide a very accurate indication of the voltage drop over the power switch. The zero voltage drop register can be updated multiple times during application runtime to compensate for different temperatures.

In alternative examples, such as in the case where a DESAT pin cannot be used to detect the current direction, an OCP can have an additional comparator to issue the trigger. In a case where the driver circuit does not detect the change of the current direction, the driver circuit may alternatively be triggered by an external signal to measure the zero-current voltage drop on the external diode and resistor. Also, differential measurements can be done in a situation where a sample and hold circuit is configured to store a zero-current voltage drop as differential measurement reference.

Figure 7:
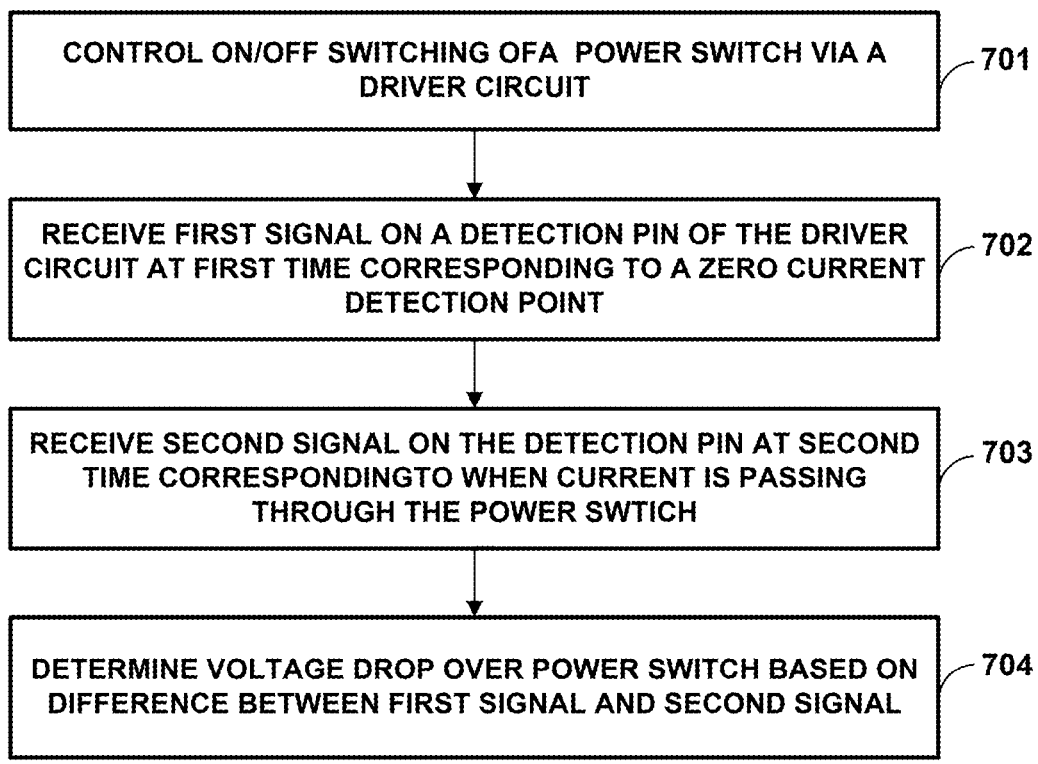
FIG. 7 is a flow diagram showing a method according to this disclosure.

FIG. 7 is a flow diagram showing a method according to this disclosure. FIG. 7 will be described from the perspective of driver circuit 102 or system 100, although other circuits or systems could perform the method. As shown in FIG. 7, driver circuit 102 controls ON/OFF switching of power switch 126 (701). According to this disclosure, driver circuit 102 receives a first signal on a detection pin 118 at a first pint in time that corresponds to a zero current detection point (702), e.g., at point 510 as shown in FIG. 5B. The first signal indicates a first voltage drop over one or more other circuit elements 122, but the first signal does not reflect any voltage drop over power switch 126 because no current is passing through power switch 126 at the zero-current detection point. In addition, driver circuit 102 receives a second signal on the detection pin, wherein the second signal corresponds to a second point in time when current is passing through the power switch (703). The second signal indicates a voltage drop over power switch 126 in combination with a second voltage drop over one or more other circuit elements 122. Driver circuit 102 may be configured to determine the voltage drop over power switch 126 based on a difference between the first signal and the second signal (704).

In some cases, driver circuit 102 may be configured to define the first point in time (e.g., corresponding to point 510 shown in FIG. 5B) based on a current changing direction in the power switch. Driver circuit 102, in some examples, may control power switch 126 based on the determined voltage drop over the power switch 126. Also, controller 106 may be configured to calculate a resistance of power switch 126 based on the voltage drop over power switch 126 and an indication (e.g., a measurement) of current through the power switch (shown as IDS in FIG. 1). In this case, the method of FIG. 8 may further include determining a temperature of power switch 126 based on the calculated resistance. For example, controller 106 may be configured to determine the temperature of power switch 126 based on the calculated resistance by applying a lookup or calculation that applies the temperature-to-resistance relationship shown in FIG. 3. In some examples, controller 106 may be further configured to predict or determine aging associated with power switch (e.g., perform end-of-life prediction or issue end-of-life alerts) based the calculated resistance and/or the calculated temperatures. A calculated resistance or the determined voltage drop over the power switch 126 may also be communicated to controller 106 in other ways, such as by using a serial peripheral interface (SPI) or in other ways.

The following clauses may illustrate one or more aspects of the disclosure.

Clause 1—A driver circuit configured to control a power switch, the driver circuit comprising: an output pin, wherein the driver circuit is configured to deliver drive signals from the output pin to the power switch to control ON/OFF switching of the power switch; and a detection pin configured to receive a first signal associated with the power switch, wherein the first signal corresponds to a first point in time when current is not passing through the power switch and wherein the first signal indicates a first voltage drop over one or more other circuit elements, wherein the detection pin is further configured to receive a second signal associated with the power switch, wherein the second signal corresponds to a second point in time when current is passing through the power switch and wherein the second signal indicates a voltage drop over the power switch in combination with a second voltage drop over one or more other circuit elements, and wherein the driver circuit is configured to determine the voltage drop over the power switch based on a difference between the first signal and the second signal.

Clause 2—The driver circuit of clause 1, further comprising a memory configured to store the first signal.

Clause 3—The driver circuit of clause 2, wherein the driver circuit is configured to periodically update the first signal stored in the memory.

Clause 4—The driver circuit of any of clauses 1-3, wherein the driver circuit comprises an ADC configured generate an output signal indicative of the difference between the first signal and the second signal, wherein the driver circuit is configured to communicate the output signal to a controller that controls the driver circuit.

Clause 5—The driver circuit of any of clauses 1-4, wherein the one or more other circuit elements comprise a diode and a resistor.

Clause 6—The driver circuit of clause 5, wherein detection pin comprises a DESAT detection pin, the driver circuit further comprising protection logic that is configured to detect whether the power switch is in a desaturation mode based on a magnitude of the first signal and disable the power switch in response to detecting that the power switch is in the desaturation mode.

Clause 7—The driver circuit of clause 6, wherein the driver circuit is configured to deliver a current on the detection pin when the protection logic detects whether the power switch is in a desaturation mode.

Clause 8—The driver circuit of any of clauses 1-7, wherein the power switch comprises: a silicon MOSFET; a silicon carbide SiC MOSFET; or a gallium nitride GaN MOSFET.

Clause 9—The driver circuit of any of clauses 1-8, wherein the driver circuit is configured to control the ON/OFF switching of the power switch based on the determined voltage drop over the power switch.

Clause 10—The driver circuit of any of clause 1-5 or 8-9, wherein detection pin comprises an overcurrent protection (OCP) pin.

Clause 11—The driver circuit of any of clauses 1-10, wherein the driver circuit is configured to define the first point in time based on a current changing direction in the power switch.

Clause 12—A system comprising: a controller; and a driver circuit configured to control a power switch based on control signals from the controller, the driver circuit comprising: an output pin, wherein the driver circuit is configured to deliver drive signals from the output pin to the power switch to control ON/OFF switching of the power switch based on the control signals from the controller; and a detection pin configured to receive a first signal associated with the power switch, wherein the first signal corresponds to a first point in time when current is not passing through the power switch and wherein the first signal indicates a first voltage drop over one or more other circuit elements, wherein the detection pin is further configured to receive a second signal associated with the power switch, wherein the second signal corresponds to a second point in time when current is passing through the power switch and wherein the second signal indicates a voltage drop over the power switch in combination with a second voltage drop over one or more other circuit elements, and wherein the driver circuit is configured to determine the voltage drop over the power switch based on a difference between the first signal and the second signal.

Clause 13—The system of clause 12, the driver circuit further comprising a memory configured to store the first signal, wherein the driver circuit is configured to periodically update the first signal stored in the memory.

Clause 14—The system of clause 12 or 13, wherein the driver circuit comprises an ADC configured generate an output signal indicative of the difference between the first signal and the second signal, wherein the driver circuit is configured to communicate the output signal to the controller.

Clause 15—The system of any of clauses 12-14, wherein the one or more other circuit elements comprise a diode and a resistor, wherein detection pin comprises a desaturation (DESAT) detection pin, the driver circuit further comprising protection logic that is configured to detect whether the power switch is in a desaturation mode based on a magnitude of the first signal and disable the power switch in response to detecting that the power switch is in the desaturation mode, wherein the driver circuit is configured to deliver a current on the detection pin when the protection logic detects whether the power switch is in a desaturation mode.

Clause 16—The system of any of clauses 12-15, wherein the driver circuit is configured to define the first point in time based on a current changing direction in the power switch.

Clause 17—The system of any of clauses 12-16, wherein the controller is configured to: receive an indication of the voltage drop over the power switch; receive an indication of current through the power switch; and calculate a resistance of the power switch based on the indication of the voltage drop over the power switch and the indication of the current.

Clause 18—The system of clause 17, wherein the controller is configured to determine a temperature of the power switch based on the calculated resistance, and control the driver circuit based on the determined temperature.

Clause 19—The system of any of clause 12-18, further comprising the power switch.

Clause 20—The system of any of clauses 12-19, further comprising a plurality of driver circuits configured to control a plurality of power switches, wherein the plurality of power switches is configured to control operation of a multi-phase electrical motor.

Clause 21—A method comprising: controlling ON/OFF switching of a power switch via a driver circuit; receiving a first signal on a detection pin associated with the power switch, wherein the first signal corresponds to a first point in time when current is not passing through the power switch and wherein the first signal indicates a first voltage drop over one or more other circuit elements; receiving a second signal on the detection pin, wherein the second signal, wherein the second signal corresponds to a second point in time when current is passing through the power switch and wherein the second signal indicates a voltage drop over the power switch in combination with a second voltage drop over one or more other circuit elements; and determining the voltage drop over the power switch based on a difference between the first signal and the second signal.

Clause 22—The method of clause 21, further comprising: defining the first point in time based on a current changing direction in the power switch.

Clause 23—The method of clause 21 or 22, further comprising: controlling the power switch based on the determined voltage drop over the power switch.

Clause 24—The method of any of clauses 21-23, further comprising: calculating a resistance of the power switch based on the voltage drop over the power switch and an indication of current through the power switch.

Clause 25—The method of clause 24, further comprising: determining a temperature of the power switch based on the calculated resistance.

Various devices, circuits, methods, and features have been described in this disclosure. These and other devices, circuits, methods and features are within the scope of the following claims.

The invention claimed is:

1. A driver circuit configured to control a power switch, the driver circuit comprising:
an output pin, wherein the driver circuit is configured to deliver drive signals from the output pin to the power switch to control ON/OFF switching of the power switch; and
a detection pin configured to receive a first signal associated with the power switch, wherein the first signal corresponds to a first point in time when current is not passing through the power switch and wherein the first signal indicates a first voltage drop over one or more other circuit elements,
wherein the detection pin is further configured to receive a second signal associated with the power switch, wherein the second signal corresponds to a second point in time when current is passing through the power switch and wherein the second signal indicates a voltage drop over the power switch in combination with a second voltage drop over one or more other circuit elements, and
wherein the driver circuit is configured to determine the voltage drop over the power switch based on a difference between the first signal and the second signal.

2. The driver circuit of claim 1, further comprising a memory configured to store the first signal.

3. The driver circuit of claim 2, wherein the driver circuit is configured to periodically update the first signal stored in the memory.

4. The driver circuit of claim 1, wherein the driver circuit comprises an analog-to-digital converter (ADC) configured generate an output signal indicative of the difference between the first signal and the second signal, wherein the driver circuit is configured to communicate the output signal to a controller that controls the driver circuit.

5. The driver circuit of claim 1, wherein the one or more other circuit elements comprise a diode and a resistor.

6. The driver circuit of claim 5, wherein detection pin comprises a desaturation (DESAT) detection pin, the driver circuit further comprising protection logic that is configured to detect whether the power switch is in a desaturation mode based on a magnitude of the first signal and disable the power switch in response to detecting that the power switch is in the desaturation mode.

7. The driver circuit of claim 6, wherein the driver circuit is configured to deliver a current on the detection pin when the protection logic detects whether the power switch is in a desaturation mode.

8. The driver circuit of claim 1, wherein the power switch comprises:
a silicon metal oxide semiconductor field effect transistor (MOSFET);
a silicon carbide (SiC) MOSFET; or
a gallium nitride (GaN) MOSFET.

9. The driver circuit of claim 1, wherein the driver circuit is configured to control the ON/OFF switching of the power switch based on the determined voltage drop over the power switch.

10. The driver circuit of claim 1, wherein detection pin comprises an overcurrent protection (OCP) pin.

11. The driver circuit of claim 1, wherein the driver circuit is configured to define the first point in time based on a current changing direction in the power switch.

12. A system comprising:
a controller; and
a driver circuit configured to control a power switch based on control signals from the controller, the driver circuit comprising:
an output pin, wherein the driver circuit is configured to deliver drive signals from the output pin to the power switch to control ON/OFF switching of the power switch based on the control signals from the controller; and a detection pin configured to receive a first signal associated with the power switch, wherein the first signal corresponds to a first point in time when current is not passing through the power switch and wherein the first signal indicates a first voltage drop over one or more other circuit elements, wherein the detection pin is further configured to receive a second signal associated with the power switch, wherein the second signal corresponds to a second point in time when current is passing through the power switch and wherein the second signal indicates a voltage drop over the power switch in combination with a second voltage drop over one or more other circuit elements, and wherein the driver circuit is configured to determine the voltage drop over the power switch based on a difference between the first signal and the second signal.

13. The system of claim 12, the driver circuit further comprising a memory configured to store the first signal, wherein the driver circuit is configured to periodically update the first signal stored in the memory.

14. The system of claim 12, wherein the driver circuit comprises an analog-to-digital converter (ADC) configured generate an output signal indicative of the difference between the first signal and the second signal, wherein the driver circuit is configured to communicate the output signal to the controller.

15. The system of claim 12, wherein the one or more other circuit elements comprise a diode and a resistor, wherein detection pin comprises a desaturation (DESAT) detection pin, the driver circuit further comprising protection logic that is configured to detect whether the power switch is in a desaturation mode based on a magnitude of the first signal and disable the power switch in response to detecting that the power switch is in the desaturation mode, wherein the driver circuit is configured to deliver a current on the detection pin when the protection logic detects whether the power switch is in a desaturation mode.

16. The system of claim 12, wherein the driver circuit is configured to define the first point in time based on a current changing direction in the power switch.

17. The system of claim 12, wherein the controller is configured to:
receive an indication of the voltage drop over the power switch;
receive an indication of current through the power switch; and
calculate a resistance of the power switch based on the indication of the voltage drop over the power switch and the indication of the current.

18. The system of claim 17, wherein the controller is configured to determine a temperature of the power switch based on the calculated resistance, and control the driver circuit based on the determined temperature.

19. The system of claim 12, further comprising the power switch.

20. The system of claim 12, further comprising a plurality of driver circuits configured to control a plurality of power switches, wherein the plurality of power switches is configured to control operation of a multi-phase electrical motor.

21. A method comprising:
controlling ON/OFF switching of a power switch via a driver circuit;
receiving a first signal on a detection pin associated with the power switch, wherein the first signal corresponds to a first point in time when current is not passing through the power switch and wherein the first signal indicates a first voltage drop over one or more other circuit elements;
receiving a second signal on the detection pin, wherein the second signal, wherein the second signal corresponds to a second point in time when current is passing through the power switch and wherein the second signal indicates a voltage drop over the power switch in combination with a second voltage drop over one or more other circuit elements; and
determining the voltage drop over the power switch based on a difference between the first signal and the second signal.

22. The method of claim 21, further comprising:
defining the first point in time based on a current changing direction in the power switch.

23. The method of claim 21, further comprising:
controlling the power switch based on the determined voltage drop over the power switch.

24. The method of claim 21, further comprising:
calculating a resistance of the power switch based on the voltage drop over the power switch and an indication of current through the power switch.

25. The method of claim 24, further comprising:
determining a temperature of the power switch based on the calculated resistance.

* * * * *